United States Patent
Vendryes et al.

(10) Patent No.: US 8,525,600 B1
(45) Date of Patent: Sep. 3, 2013

(54) TEMPERATURE-COMPENSATED CRYSTAL OSCILLATOR ASSEMBLY

(75) Inventors: Robert S. Vendryes, Aurora, CO (US); Ericka Sleight, Mountain View, CA (US); Donald L. Davis, Milpitas, CA (US); Jerome Chang, San Jose, CA (US); Jack L. Mix, Livermore, CA (US); Ronald Dammann, San Jose, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 59 days.

(21) Appl. No.: 13/281,369

(22) Filed: Oct. 25, 2011

Related U.S. Application Data

(60) Provisional application No. 61/406,784, filed on Oct. 26, 2010.

(51) Int. Cl.
*H03B 5/32* (2006.01)
*H01L 41/053* (2006.01)

(52) U.S. Cl.
USPC ............. 331/68; 331/158; 310/344; 310/348

(58) Field of Classification Search
USPC ................. 310/315, 344, 348, 349, 351–354; 331/65, 66, 68, 69, 108 C, 154, 158, 167
See application file for complete search history.

(56) References Cited

U.S. PATENT DOCUMENTS

| | | | | |
|---|---|---|---|---|
| 3,805,098 A * | 4/1974 | Carpenter et al. | ............ | 310/344 |
| 4,404,459 A * | 9/1983 | Harton | ............ | 219/209 |
| 5,455,479 A * | 10/1995 | Heimerl | ............ | 310/353 |
| 6,049,256 A * | 4/2000 | Fry | ............ | 331/69 |
| 6,201,449 B1 * | 3/2001 | Korber, Jr. | ............ | 331/44 |
| 6,984,925 B2 * | 1/2006 | Morley et al. | ............ | 310/348 |
| 7,427,902 B2 * | 9/2008 | Matsuoka | ............ | 331/69 |
| 7,514,852 B2 * | 4/2009 | Kasahara et al. | ............ | 310/343 |
| 8,188,800 B2 * | 5/2012 | Fry et al. | ............ | 331/162 |
| 8,232,845 B2 * | 7/2012 | Ruby et al. | ............ | 331/68 |
| 2007/0268078 A1 * | 11/2007 | Lee | ............ | 331/68 |

* cited by examiner

*Primary Examiner* — Levi Gannon
(74) *Attorney, Agent, or Firm* — McDermott Will & Emery LLP

(57) ABSTRACT

A protective assembly that is adapted to provide temperature isolation for an electronic device is disclosed. The assembly includes a housing having a cavity with a top surface and at least one side surface. The housing is configured to accept an electronic device having a top and a bottom in the cavity with the top of the electronic device proximate to the top surface of the cavity. The housing is further configured to maintain a vacuum within the cavity. The assembly includes at least one support disposed within the cavity. The at least one support is configured to contact the housing only at a first point proximate to the top surface of the cavity and contact the electronic device only at a second point that is proximate to the bottom of the electronic device.

20 Claims, 5 Drawing Sheets

TEMPERATURE-COMPENSATED CRYSTAL OSCILLATOR ASSEMBLY

CROSS-REFERENCE TO RELATED APPLICATIONS

This application claims priority to U.S. Provisional Application No. 61/406,784, filed Oct. 26, 2010 and currently pending, which is incorporated herein by reference.

STATEMENT REGARDING FEDERALLY SPONSORED RESEARCH OR DEVELOPMENT

Not applicable.

BACKGROUND

1. Field

The present disclosure generally relates to electronic reference devices and, in particular, to low-power, temperature-compensated crystal oscillators.

2. Description of the Related Art

Crystal oscillators are often used as reference sources for time in electronic circuits. The frequency of the oscillatory signal generated by the crystal is affected by the temperature of the crystal. When it is desired to stabilize the oscillation frequency of the crystal to less than one part per billion per minute, or to use the oscillations to create a clock with an accuracy of one second per year, it is desirable to stabilize the temperature of the crystal oscillator. Some conventional temperature stabilization systems use a feedback-controlled heater to maintain the temperature of the crystal at a desired level, but this consumes more power than may be desirable as the target temperature of the crystal must be above the highest expected ambient temperature. The power consumption of current technology for time reference devices having a stability of 0.25 parts-per-billion per minute (ppb/min) is about approximately 350 milliwatts (mW) for oven-controlled oscillators and 125 mW for chip-scale atomic clocks.

SUMMARY

There is a need to provide a system for stabilizing the temperature of an electronic device, such as a crystal oscillator, while minimizing the power consumption of the system. An enclosure that provides a high degree of thermal isolation of the electronic device from the ambient environment meets this and other needs. The design of this enclosure enables use of a low-power crystal oscillator that may result in an overall power consumption of 4 mW or less.

In certain embodiments, a protective assembly that is adapted to provide temperature isolation for an electronic device is disclosed. The assembly includes a housing having a top surface and at least one side surface. The housing is configured to accept an electronic device having a top and a bottom in the cavity with the top of the electronic device proximate to the top surface of the cavity. The housing is further configured to allow at least a partial vacuum within the cavity. The assembly also includes at least one support disposed within the cavity. The at least one support is configured to contact the housing only at a first point proximate to the top surface of the cavity and contact the electronic device only at a second point that is proximate to the bottom of the electronic device.

In certain embodiments, a temperature-stabilized electronic package is disclosed. The package includes a housing comprising a cavity having a top surface and at least one side surface and an electronic device having a top and a bottom. The electronic device is disposed within the cavity with the top of the electronic device proximate to the top of the cavity. The package also includes at least one support disposed within the cavity. The at least one support is configured to contact the housing only at a first point proximate to the top surface of the cavity and contact the electronic device only at a second point that is proximate to the bottom of the electronic device. Substantially all gas has been evacuated from the interior of the housing.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The method and system disclosed herein are presented in terms of a crystal oscillator encased in a temperature stabilizing housing. Crystal oscillators are excellent examples of electronic devices that benefit from temperature stabilization, although other electronic devices may also be improved by operating at a constant temperature. Nothing in this disclosure should be interpreted, unless specifically stated as such, to limit the application of any method or system disclosed herein to use with a crystal oscillator.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

Figure 1:
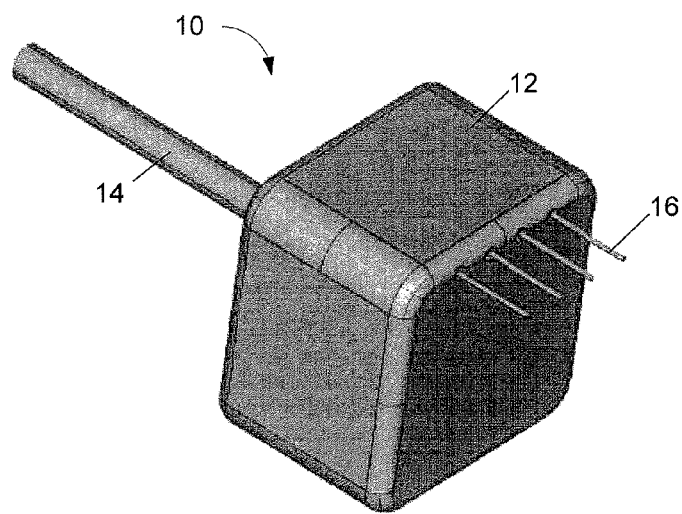
FIG. 1 is a perspective view of a sealed Temperature Compensated Crystal Oscillator (TCXO) assembly according to certain aspects of this disclosure.

FIG. 1 is a perspective view of a sealed Temperature Compensated Crystal Oscillator (TCXO) assembly 10 according to certain aspects of this disclosure. The TCXO assembly 10 includes a housing 12 having a vacuum port 14. The TCXO assembly 10 also includes feed-through connectors 16 as seen on the lower portion of housing 12. In an exemplary embodiment, the housing 12 is less than one inch in length, width, or height.

Figure 2:
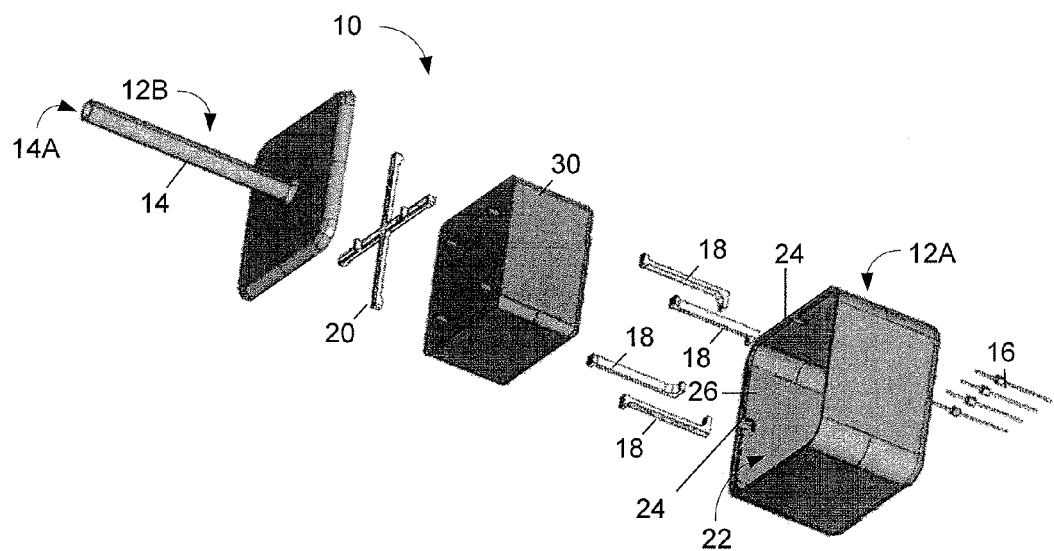
FIG. 2 is an exploded view of the TCXO assembly from FIG. 1 according to certain aspects of this disclosure.

FIG. 2 is an exploded view of the TCXO assembly 10 from FIG. 1 according to certain aspects of this disclosure. The TCXO assembly 10 includes a base 12A and a cap 12B that together form the housing 12 of FIG. 1. Within the housing 12, an electronic device 30 is supported by a plurality of supports 18 within the cavity 22 of base 12A. In certain embodiments, the electronic device 30 is a hermetically sealed Temperature Compensated Crystal Oscillator (hTCXO) that comprises a crystal oscillator. The details of the construction of the various elements are discussed in greater detail with respect to FIGS. 3A-3E. A top support 20 is located above electronic device 30 and below cap 12B. The design details and function of top support 20 are discussed in greater detail with respect to FIG. 4. The cap 12B and base 12A are configured to allow at least a partial vacuum within the cavity, i.e. to be sealed to each other such that gas will not pass from the exterior to the interior of the assembled housing 12 at a rate that will substantially degrade a vacuum within the housing. It can be seen that, in this embodiment, cap 12B includes a vacuum port 14 that is a tube having a conduit 14A projecting outwards from the flat portion of cap 12B. In certain embodiments, the cap 12B and base 12A are configured to be assembled and sealed to each other while in a vacuum environment. The conduit 14A, in this embodiment, is formed from stainless steel and the interior surface of the conduit 14A has been specially cleaned such that crimping of the tube under a high pressure, for example 6,000 psi, will cause the interior surfaces to fuse and form a vacuum seal. In certain embodiments, a vacuum is drawn through conduit 14A during assembly after the housing 12 is otherwise sealed and the conduit 14A is crimped to complete the vacuum seal of the housing 12.

A plurality of feed-through connectors 16 are shown to the right of base 12A in FIG. 2. Each feed-through connector 16 comprises a conductive pin surrounded at one point by a glass bead. In certain embodiments, the feed-through connector 16 comprises a metal alloy, such as Kovar™ or Invar™, having a coefficient of thermal expansion substantially the same as glass. In certain embodiments, the feed-through connectors 16 include filtering elements.

The supports 18 and top support 20 comprise a material having a low thermal conductivity. In an exemplary embodiment, the supports 18 and top support 20 are formed from a polyetherimide polymer such as Ultem. The material used for the supports 18 and top support 20 should also have a low outgassing characteristic so as to maintain the desired long-term vacuum within the housing 12 after the cap 12B and base 12A are sealed to each other.

Figure 3A:
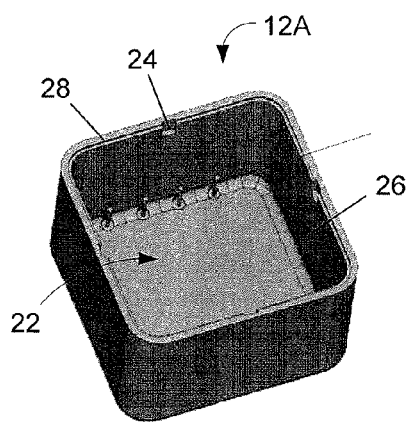
FIGS. 3A-3E illustrate an assembly sequence for the TCXO assembly of FIG. 1 according to certain aspects of this disclosure.

FIGS. 3A-3E illustrate an assembly sequence for the TCXO assembly 10 of FIG. 1 according to certain aspects of this disclosure. In FIG. 3A, the bare base 12A is shown wherein it can be seen that cavity 22 is plated on interior side surfaces 26 and the bottom with gold as an exemplary low thermal emissivity coating. The feed-through connectors 16 can be seen protruding into the cavity 22. In this embodiment, the feed-through connectors 16 are soldered to the base 12A. In certain embodiments, the feed-through connectors 16 are sealed to the base 12A with an epoxy. The low-thermal conductivity wires that are attached to the internal end of the conductive pins of the feed-through connectors 16 have been omitted for clarity. A sealing edge 28 is visible around the perimeter of cavity 22 and notches 24 are formed into the sealing edge 28. In this embodiment, one notch 24 is formed in sealing edge 28 on each of the four sides of the base 12A.

Figure 3B:
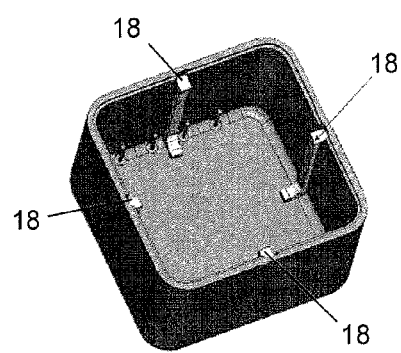

FIG. 3B depicts four supports 18 placed into cavity 22. In this embodiment, each support 18 is formed into an elongated "Z" shape having a leg at each end extending from the main element. The configuration of the supports 18 is discussed in greater detail with respect to FIG. 4. One leg of each support 18 fits into a respective notch 24. The legs at the other ends of supports 18 can be seen to extend toward the center of cavity 22.

Figure 3C:
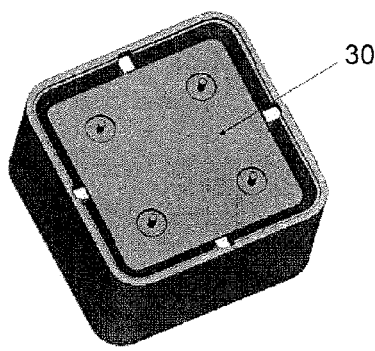

In FIG. 3C, an electronic device 30, such as an hTCXO, has been placed into cavity 22 and is supported by the four supports 18. When centered, the supports 18 contact the electronic device 30 only on the bottom surface or at an edge proximate to the bottom. The only paths of thermal conduction are from the bottom of the electronic device 30 through the length of the four supports 18 and into the base 12A at the notches 24. It can be seen that the top of electronic device 30 is at or below the level of the sealing edge 28 and the top surface of the top leg of supports 18. The four electrical contacts of the electronic device 30 can be seen on the top surface of the electronic device 30, where the wires that connect these contacts to the feed-through connectors 16 have been omitted for clarity.

Figure 3D:
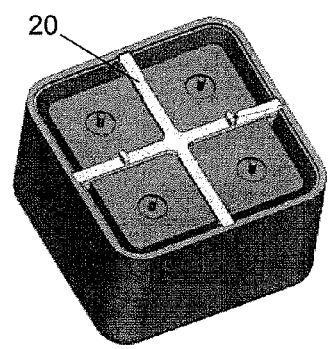

FIG. 3D shows the top support 20 placed over electronic device 30 wherein the ends of the top support 20 coincide with the top legs of supports 18 and also fit into notches 24. With top support 20 in place, the electronic device 30 will be constrained from contact with the interior surface of the cap 12B as is discussed in greater detail with respect to FIG. 4.

Figure 3E:
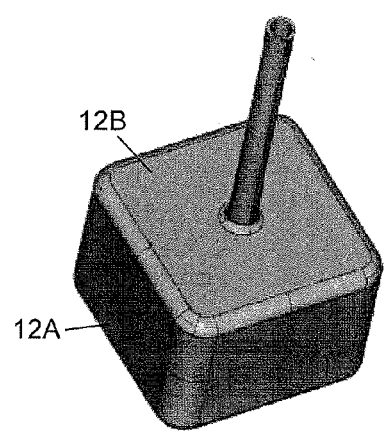

FIG. 3E depicts the top cap 12B placed over the base 12A so as to form a complete housing 12. In this embodiment, the cap 12B has been laser welded to the base 12A and the edge of cap 12B that mates with the sealing edge 28 of base 12A which is configured for laser welding. In certain embodiments, the sealing edge 28 and the mating edge of cap 12B are configured for electron beam welding. In certain embodiments, the sealing edge 28 and the mating edge of cap 12B are configured for tungsten inert gas (TIG) welding. In certain embodiments, the sealing edge 28 and the mating edge of cap 12B are configured for bonding.

Figure 4:
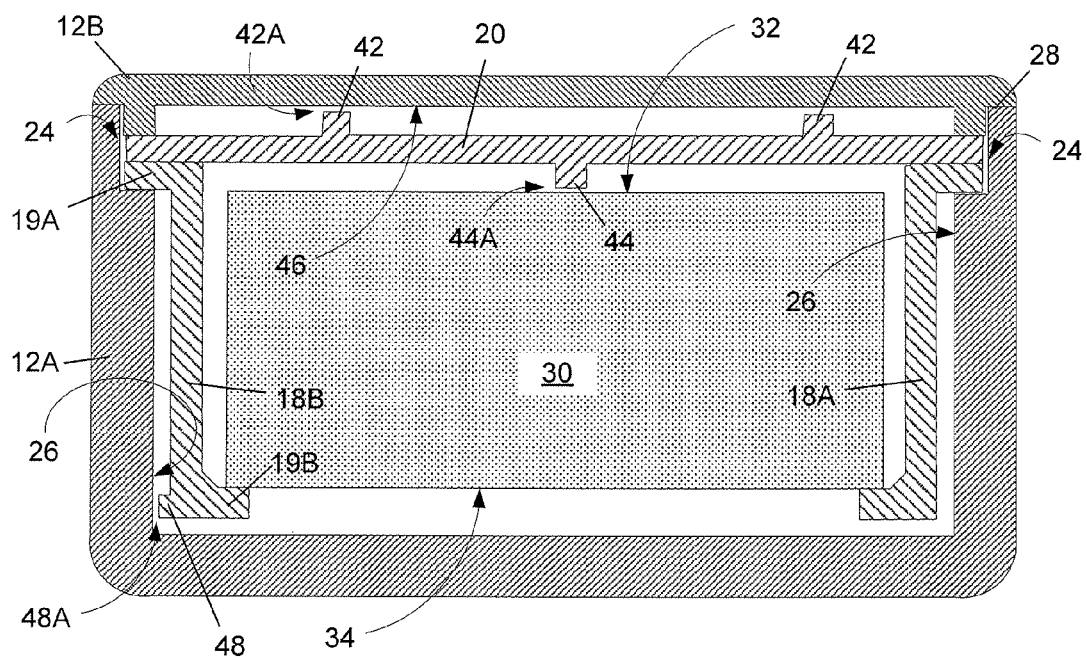
FIG. 4 is a cross section of an exemplary embodiment of the TCXO assembly according to certain aspects of this disclosure.

FIG. 4 is a cross section of an exemplary embodiment of the TCXO assembly 10 according to certain aspects of this disclosure. It can be seen that base 12A and cap 12B together form cavity 22. In this embodiment, the notches 24 are formed primarily as a recess in the sealing edge 28 of base 12A with cap 12B forming the upper surface of the notch 24. On the left of FIG. 4, a support 18B is shown having a lateral bumper 48 adjacent to the bottom leg 19B. The bumper 48 is positioned approximate but not in contact with interior side surface 26 of base 12A. In certain embodiments, the gap 48A is less than 0.005 inches. The gap 48A provides thermal isolation of support 18B. The bumper 48 will come in contact with the side surface 26 if the support 18B if deformed, for example by the force caused by lateral acceleration of the electronic device 30. On the right side of FIG. 4, an embodiment of support 18A can be seen that does not have the lateral bumper 48.

The top support 20, in this example, comprises four legs that cooperate with the respective top legs 19A of the four supports 18, wherein only supports 18A and 18B are visible in the cross-section of FIG. 4, to provide support of the electronic device 30 within the cavity 22. The top support 20 includes a travel stop 44 that is, in this embodiment, located in the center of the top support 20 and disposed such that there is a gap 44A between the travel stop 44 and the top surface 32 of the electronic device 30. This gap 44A provides thermal isolation while limiting the vertical motion of electronic device 30. Top support 20 also includes, in this embodiment, two top bumpers 42 each having a gap 42A between the top bumper 42 and the cap 12B. In certain embodiments, the gaps 42A and 44A are less than 0.005 inches. These gaps 42A also provide thermal isolation while limiting the motion of the top support 20 if deformed, for example by the force caused by vertical acceleration of the electronic device 30. Overall, the electronic device 30 is allowed a small amount of travel in each direction while maintaining good thermal isolation when not subject to acceleration. In this exemplary embodiment, the gaps 42A, 44A, and 48A are such that the electronic device 30 can travel a maximum of 0.003 inches in any direction before coming in contact with a stop while maintaining gaps 42A, 44A, and 48A in normal operation so as to minimize thermal conductivity between the electronic device 30 and the housing 12. In certain embodiments, one or more of the gaps 42A, 44A, and 48A may be zero, i.e. in contact, so as to minimize movement of the electronic device 30 during exposure to shock and vibration.

The housing 12 and feed-through connectors 16 cooperate to isolate the electronic device 30 from the effects of the surrounding electrical and electromagnetic environment as well as from the thermal environment. The housing 12 forms a Faraday cage that attenuates electromagnetic signals propagating through the housing 12. The feed-through connectors 16, in certain embodiments, include filtering that attenuates certain frequency ranges of electrical signals.

The design of this embodiment of the TCXO assembly 10 enables use of a low-power hTCXO 30 that results in overall power consumption of 4 mW or less, wherein the temperature stability of the electronic device may be improved by the low amount of power dissipated within the electronic device.

Further isolation of the electronic device 30 from the effects of the surrounding electrical and electromagnetic environment as well as from the thermal environment may be provided by use of a tightly controlled and filtered power source (not shown) to provide DC power to the TCXO assembly 10 and optimization of the drive impedance of the external circuits (not shown) connected to the hTCXO 30.

The quality of the vacuum within the cavity 22 over the life of the TCXO assembly 10, may be improved by selection of materials to be inserted within the cavity 22, including the isolators 18 and other components, having low outgassing characteristics. In addition, each component to be inserted within the cavity 22 may be thoroughly cleaned to ensure minimization of residual materials that may outgas within the cavity 22 over the life of the TCXO assembly 10.

Figure 5:
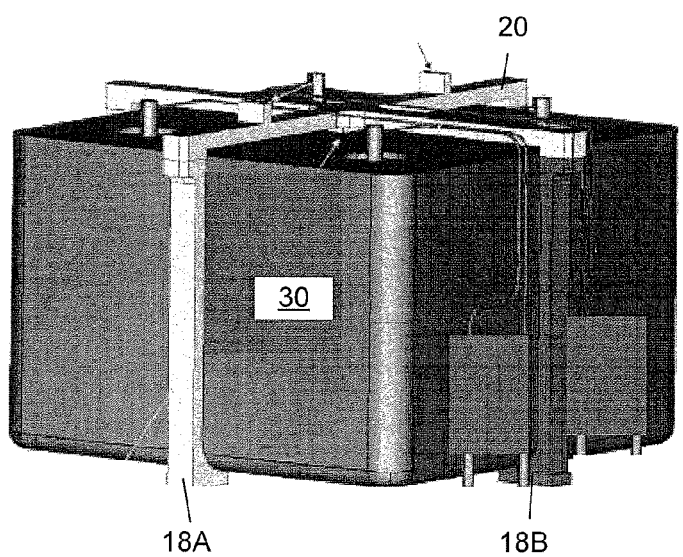
FIG. 5 is a perspective view of the electronic device with the supports and top support according to certain aspects of the present disclosure.

FIG. 5 is a perspective view of the electronic device 30 with the supports 18 and top support 20 according to certain aspects of the present disclosure. The housing 12 has been removed to provide a clear view of how the supports 18A, 18B and top support 20 cooperate to isolate the electronic device 30 from the interior surfaces of housing 12.

Figure 6:
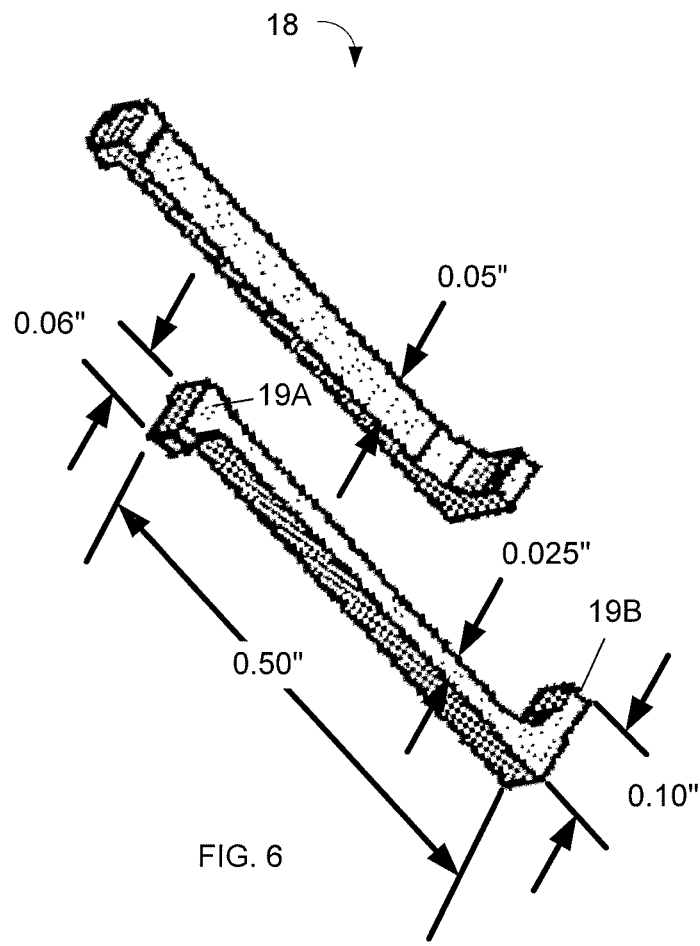
FIG. 6 is a dimensioned perspective view in two orientations of an exemplary support according to certain aspects of this disclosure.

FIG. 6 is a dimensioned perspective view in two orientations of an exemplary support 18 according to certain aspects of this disclosure. The main portion of the support 18 is approximately 0.025 inches (~0.635 millimeters) thick and 0.05 inches wide. The top leg 19A has an overall length of approximately 0.06 inches while the bottom leg 19B has an overall length of approximately 0.10 inches. The overall height of the support 18 is based on the dimensions of the electronic device 30 and, in this embodiment, is approximately 0.50 inches.

Figure 7:
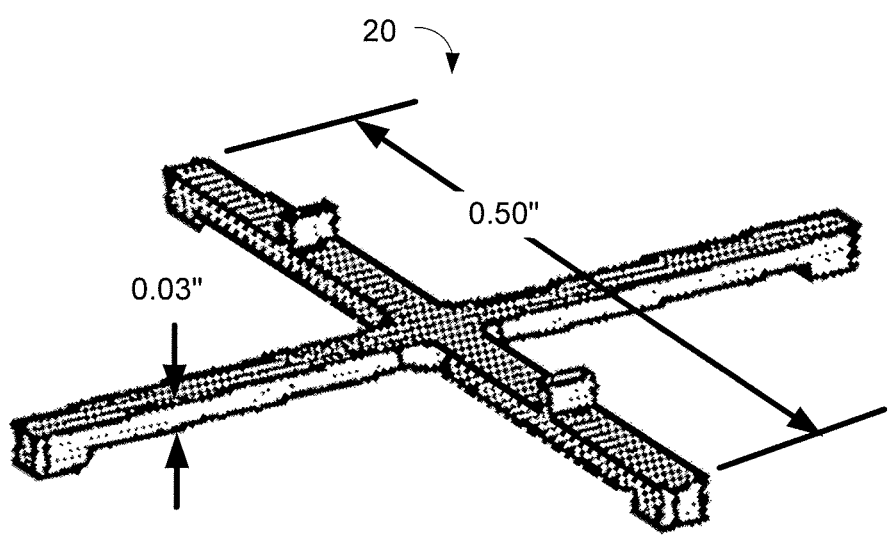
FIG. 7 is a dimensioned perspective view of an exemplary top support according to certain aspects of this disclosure.

FIG. 7 is a dimensioned perspective view of an exemplary top support 20 according to certain aspects of this disclosure. The overall width of the top support 20 is based on the dimensions of the electronic device 30 and, in this embodiment, is approximately 0.50 inches. The main portion of the top support 20 is 0.03 inches thick.

Figure 8:
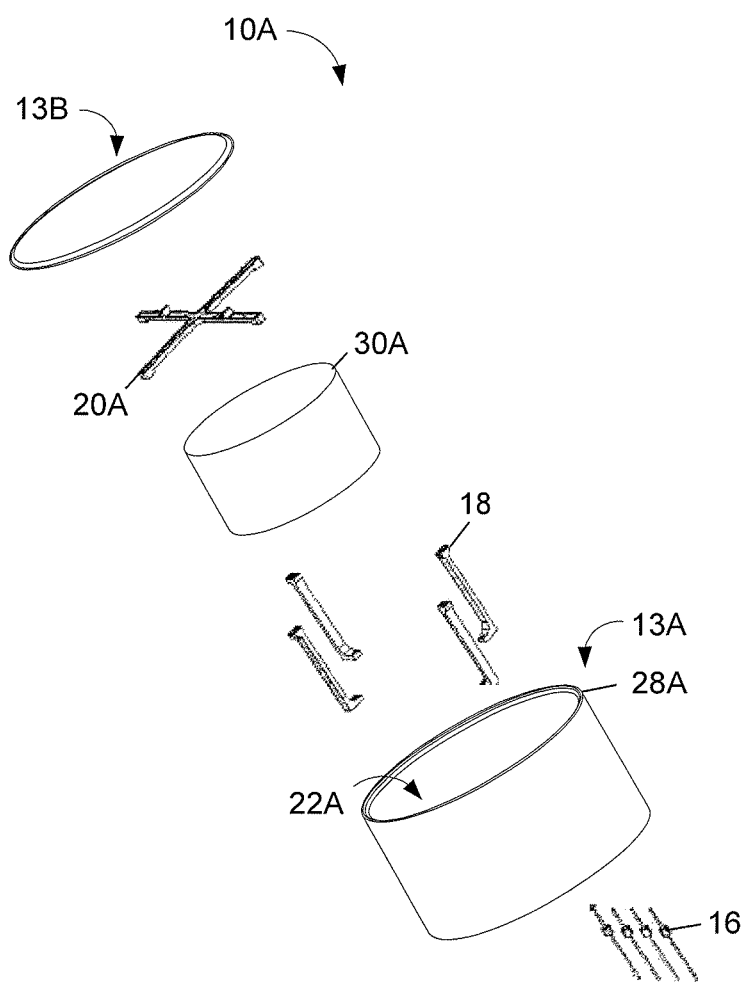
FIG. 8 is another embodiment of a TCXO assembly according to certain aspects of this disclosure.

FIG. 8 is another embodiment of a TCXO assembly 10A according to certain aspects of this disclosure. In this embodiment, the base 13A is formed as a hollow cylinder and the cap 13B is formed as a circular plate. In certain embodiments, the base and cap may be formed in any geometric shape that allows the formation of a sealed cavity. In the embodiment of FIG. 8, the electronic device 30A is provided as a cylindrical element that generally matches the shape of the cavity 22A. In this example, there are four supports 18 disposed within the cavity 22A. In certain embodiments, there are three supports 18 and three notches (not visible in FIG. 8) proximate to the sealing edge 28A, and the top support 20A is configured with three arms in place of the four arms shown in FIG. 8.

The concepts disclosed herein provides a system for isolating an electronic device, such as a crystal oscillator, from the external thermal, electrical, and electromagnetic environments. A conductive housing forms a hermetically sealed enclosure surrounding the electronic device, wherein electrical connection of the electronic device to external circuits is accomplished via feed-through connectors that maintain the hermetic seal of the enclosure. A vacuum is created within the housing and the electronic device is supported on low thermal conductivity supports to reduce the thermal transfer between the housing and the electronic device. Gaps of less than 0.005 inches are provided between various bumpers and the housing to provide travel stops during acceleration of the electronic device while maintaining thermal isolation in normal operation.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Designation of a particular surface, for example a front surface of a mirror, defines the local frame of reference, for example the regions that are in front of and behind the mirror, to be consistent with this designation.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A protective assembly adapted to provide temperature isolation for an electronic device, the assembly comprising:
   a housing comprising a cavity having a top surface and at least one side surface, the housing configured to accept the electronic device having a top and a bottom in the cavity with the top of the electronic device proximate to the top surface of the cavity, the housing further configured to maintain at least a partial vacuum within the cavity; and
   at least one support disposed within the cavity, the at least one support configured to contact the housing only at a first point proximate to the top surface of the cavity and contact the electronic device only at a second point that is proximate to the bottom of the electronic device, the at least one support comprising at least one lateral bumper configured to contact the at least one side surface of the cavity only when the at least one support is deformed.

2. The assembly of claim 1, wherein:
   the housing comprising at least one notch formed in the at least one side surface proximate to the top surface; and
   the at least one support is configured to contact the housing only within the at least one notch.

3. The assembly of claim 1, further comprising a top support comprising a travel stop, the top support configured to contact the housing only within the notches, the top support further configured such that the travel stop contacts the top surface of the electronic device only when the electronic device is displaced vertically with respect to the top support.

4. The assembly of claim 3, wherein:
   the top support further comprises at least one top bumper; and
   the top space is configured such that the top bumper contacts the top surface of the cavity only when the top support is deformed vertically.

5. The assembly of claim 1, wherein the housing comprises:
   a base comprising a pocket having a first sealing edge and a plurality of recesses formed into the first sealing edge; and
   a cap having a second sealing edge configured to mate with the first sealing edge, the cap configured to cooperate with the pocket of the base to form the cavity when the cap is coupled to the base, the second sealing edge further configured to cooperate with the plurality of recesses of the first sealing edge to form a plurality of notches when the cap is coupled to the base.

6. The assembly of claim 5, wherein the first and second sealing edges are configured to be sealed and coupled by laser welding.

7. The assembly of claim 5, wherein at least one of the cap and base further comprises a vacuum port configured to allow a vacuum to be formed within the housing after the cap and base are assembled and sealed to form the housing, the vacuum port further configured to be sealed after the vacuum is formed.

8. The assembly of claim 5, wherein the base and cap are configured to be assembled and sealed to each other while in a vacuum environment.

9. The assembly of claim 1, wherein at least a portion of the surfaces of the cavity are coated with gold.

10. The assembly of claim 1, further comprising at least one feed-through connector, wherein:
    the housing further comprises at least one hole passing from the cavity to an outside surface of the housing; and
    the at least one feed-through connector is sealingly disposed within the at least one hole.

11. The assembly of claim 10, wherein the at least one feed-through connector comprises:
    a conductor comprising a metal alloy having a first coefficient of thermal expansion; and
    an insulator comprising a glass having a second coefficient of thermal expansion that is approximately equal to the first coefficient of thermal expansion.

12. The assembly of claim 1, wherein the electronic device is a hermetically sealed crystal oscillator.

13. A temperature-stabilized electronic package comprising:
    a housing comprising a cavity having a top surface and at least one side surface;
    an electronic device having a top and a bottom, the electronic device disposed within the cavity with the top of the electronic device proximate to the top of the cavity; and
    at least one support disposed within the cavity, the at least one support configured to contact the housing only at a first point proximate to the top surface of the cavity and contact the electronic device only at a second point that is proximate to the bottom of the electronic device, the at least one support comprising at least one lateral bumper configured to contact the at least one side surface of the cavity only when the at least one support is deformed;
    wherein substantially all gas has been evacuated from the interior of the housing.

14. The package of claim 13, wherein:
    the housing comprises a plurality of notches formed in the at least one side surface proximate to the top surface; and
    the at least one support is configured to contact the housing only within at least one of the plurality of notches.

15. The package of claim 13, wherein a gas pressure within the cavity is less than or equal to $1 \times 10^{-3}$ torr.

16. The package of claim 13, further comprising a top support comprising a travel stop, the top support configured to contact the housing only within the notches, the top support further configured such that the travel stop contacts the top surface of the electronic device only when the electronic device is displaced vertically with respect to the top support.

17. The package of claim 16, wherein:
the top support further comprises at least one top bumper; and
the top space is configured such that the top bumper contacts the top surface of the cavity only when the top support is deformed vertically.

18. The package of claim 13, further comprising at least one feed-through connector, wherein:
the housing further comprises at least one hole passing from the cavity to an outside surface of the housing; and
the at least one feed-through connector is sealingly disposed within the at least one hole.

19. The package of claim 18, wherein the at least one feed-through connector comprises:
a conductor comprising a metal alloy having a first coefficient of thermal expansion; and
an insulator comprising a glass having a second coefficient of thermal expansion that is approximately equal to the first coefficient of thermal expansion.

20. The package of claim 13, wherein the electronic device is a hermetically sealed crystal oscillator.

* * * * *